United States Patent [19]
Sillner

[11] Patent Number: 6,152,006
[45] Date of Patent: Nov. 28, 2000

[54] DEVICE FOR TRANSPORTING AND/OR SORTING SMALL COMPONENTS, IN PARTICULAR SMALL ELECTRICAL COMPONENTS

[76] Inventor: Georg Sillner, Buchenstrasse 23, D-93197 Zeitlarn, Germany

[21] Appl. No.: 09/147,055

[22] PCT Filed: Jan. 29, 1998

[86] PCT No.: PCT/DE98/00268

§ 371 Date: Sep. 28, 1998

§ 102(e) Date: Sep. 28, 1998

[87] PCT Pub. No.: WO98/34452

PCT Pub. Date: Aug. 6, 1998

[30] Foreign Application Priority Data

Jan. 29, 1997 [DE] Germany ............................ 197 03 088
Mar. 5, 1997 [DE] Germany ............................ 197 09 022
Nov. 3, 1997 [DE] Germany ............................ 197 48 442

[51] Int. Cl.[7] ........................................................ B26D 7/00
[52] U.S. Cl. .................................... 83/152; 83/73; 83/405; 83/929.1; 83/929.2
[58] Field of Search .................................... 83/152, 929.1, 83/929.2, 72, 73, 404, 405

[56] References Cited

U.S. PATENT DOCUMENTS

| | | | |
|---|---|---|---|
| 4,908,092 | 3/1990 | Koibuchi | 156/556 |
| 4,914,996 | 4/1990 | Lavorel | 83/152 X |
| 5,058,721 | 10/1991 | Koibuchi | 198/345.1 |
| 5,135,098 | 8/1992 | Koibuchi | 198/345.1 |
| 5,397,423 | 3/1995 | Bantz et al. | 156/362 |

FOREIGN PATENT DOCUMENTS 276141 7/1988 European Pat. Off. .
3630317 3/1988 Germany .

*Primary Examiner*—M. Rachuba
*Attorney, Agent, or Firm*—Hoffman Wasson & Gitler

[57] ABSTRACT

The invention relates to a novel design of a device for conveying small components, especially small electrical components, preferably SMDs, with at least one conveyor section which is formed by at least one first transport element and by at least one second transport element which each have a plurality of receiving areas for receiving and holding one component at a time, and which form a common transfer area on which each component is relayed from one receiving area of one transport element to the receiving area of the other transport element, the receiving areas of one transport element being formed on pipette-like vacuum chucks.

33 Claims, 13 Drawing Sheets

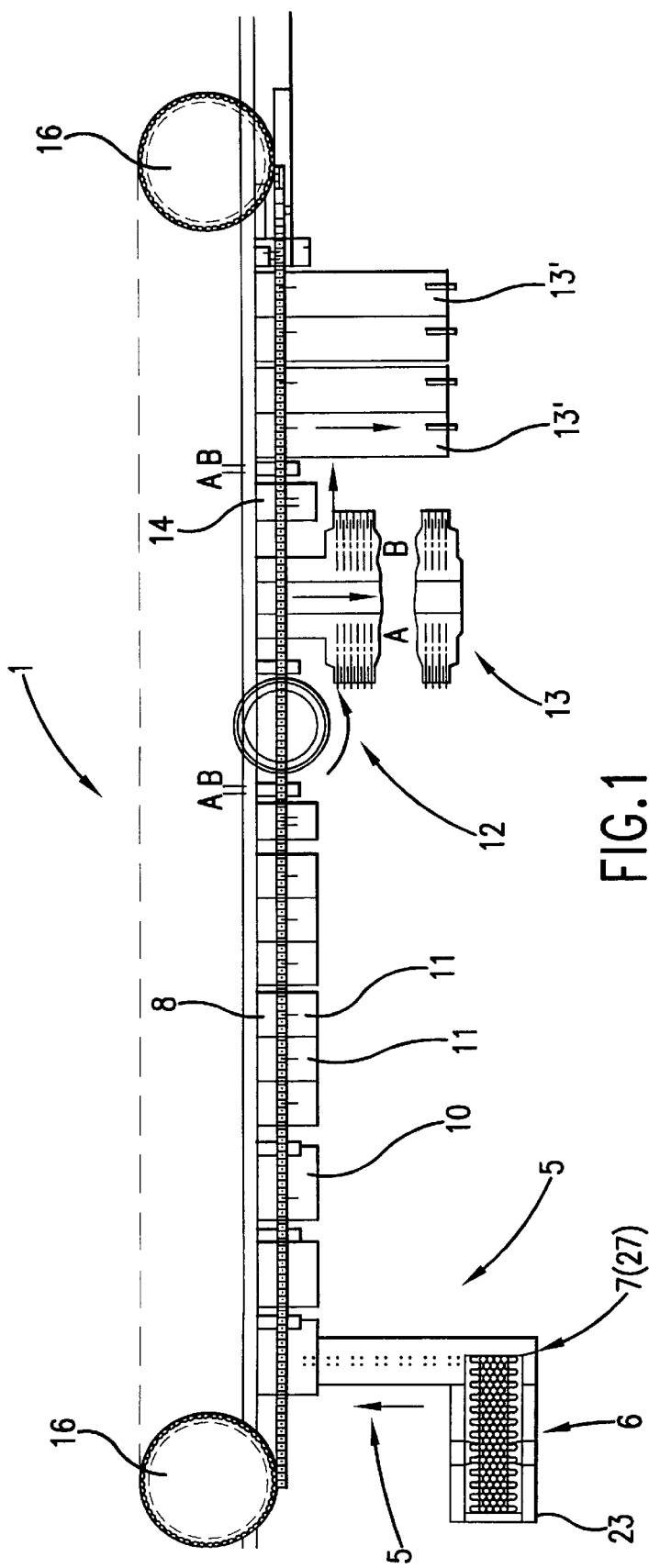
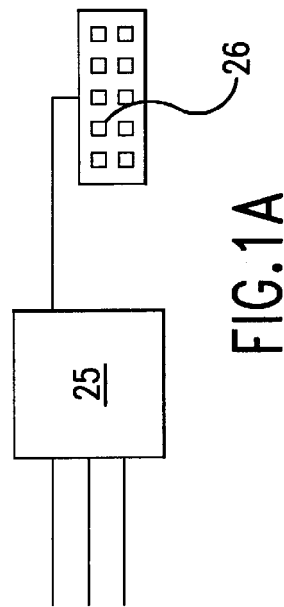
FIG. 1
FIG. 1A

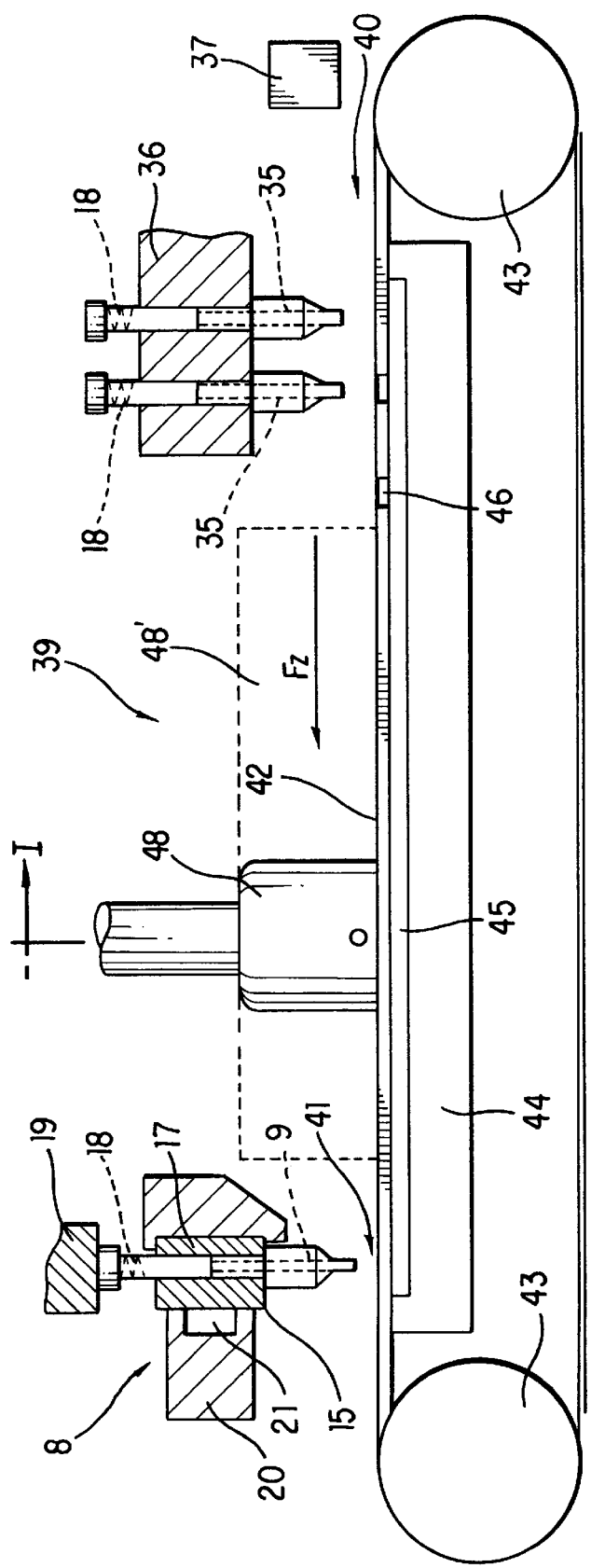
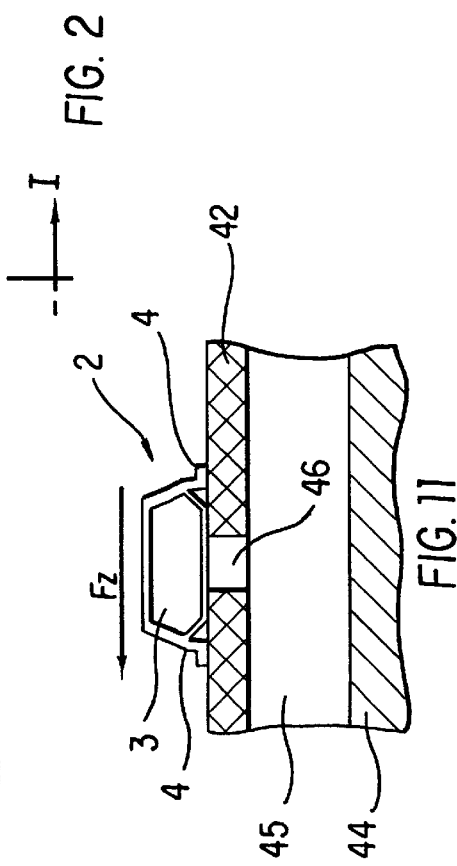

POSITION 1

DEVICE FOR TRANSPORTING AND/OR SORTING SMALL COMPONENTS, IN PARTICULAR SMALL ELECTRICAL COMPONENTS

The invention relates to a device as claimed in the preamble of patent claims 1, 5, 21 or 27.

Devices for conveying small components and especially also small electrical components, for example in the form of SMDs (surface mounted devices), are known in the most varied versions and are used for example in devices or systems in which these components are processed (for example, bending of connecting leads), measured (especially also with respect to their electrical properties and functions), deposited sorted (batch formation) and/or belted. These devices are also often called bag-and-line or bag-and-machines.

The object of the invention is to devise a device for conveying small components which can be repeatedly used in a simple version and/or has high operating reliability. To do this a device according to claim 1, 5, 21 or 27 is devised.

In one basic version of the invention the device has at least two transport elements which adjoin one another within a common conveyance section on a connection region, the components on this connection region being relayed from receiving areas of one transport element to the receiving areas of the other transport element. The receiving areas on one transport element are formed here by vacuum chucks, preferably pipette-like vacuum chucks. The receivers on the other transport element are formed by one surface of this transport element, each in the region of one opening. The transport element which is formed by a transport belt or transport wheel lies with its other surface side on a guide which has at least one vacuum channel open towards this surface side. The transport belt or transport wheel seals this vacuum channel except for the openings in the transport belt or transport wheel. The vacuum channel is connected to a negative pressure source so that the components are each held under pressure in the area of one opening. In conjunction with the formation of the receiving areas on one transport element in the form of pipette-like vacuum chucks, simple transfer of the components from one transport element to the other is possible.

According to another aspect, the invention relates to a device for conveying small components, this device being suited especially for feeding components in a system in which the components to be treated are supplied in a lead frame. Especially in multiple lead frames, i.e. in lead frames in which the components are located in several rows which extend in the longitudinal direction of the lead frame, the problem is that the machine spacing, i.e. the distance which the receiving areas of the treatment machine (for example, back-end machine) must be adapted to the grid size of the lead frame, i.e. to the distance which the components have from one another in the longitudinal direction of the lead frame [sic]. It is therefore difficult to process lead frames with a different grid size using the same machine. The device as claimed in the invention avoids this problem, i.e. solely by changing the advance for the lead frame can the device be adapted to different grid sizes. The change necessary for this purpose can be done using software.

According to another aspect, the invention relates to a device for conveying small components, especially small electrical components, preferably SMDs, with at least one transport section formed by a transport element with a plurality of holders made preferably as vacuum chucks for the components, and the holders which are moved preferably clocked along the transport section with the transport element can be moved in the direction of their axis, preferably in a vertical axis. This device is characterized in that there are holders which can turn around their axis on the transport element and that on the transport section at least one turning or rotation station is formed, on which the holders are moved past and on which a driver actuated by a drive can be coupled to the holder at this turning station at the time and can be actuated to rotate the holder.

According to another aspect, the invention relates to a device for conveying small components, especially small electrical components, preferably SMDs, with at least one transport section formed by a transport element with a plurality of holders made preferably as vacuum chucks for the components, and the holders which are moved preferably clocked along the transport section with the transport element can be moved in the direction of their axis, preferably in a vertical axis. This device is characterized in that on the transport section at least one test station which checks the presence or absence of a component on a holder is provided with a photoelectric barrier which consists of a light-emitting component, a light detector, and a light path which is formed between them and into which the vacuum channel provided in chucks (9a) is incorporated.

Developments of the invention are the subject matter of the subclaims. The invention is detailed below using the figures on one embodiment.

FIG. 1 shows in schematic form and in an overhead view a back-end machine for electrical components, together with a punch-out and positioning device as claimed in the invention;

FIG. 2 shows in an enlarged partial view and in a longitudinal section one embodiment of the conveyor or transfer belt for use in the punch-out and positioning device from FIG. 1;

FIG. 11 shows an enlarged detail representation of FIG. 2;

Figure 3:
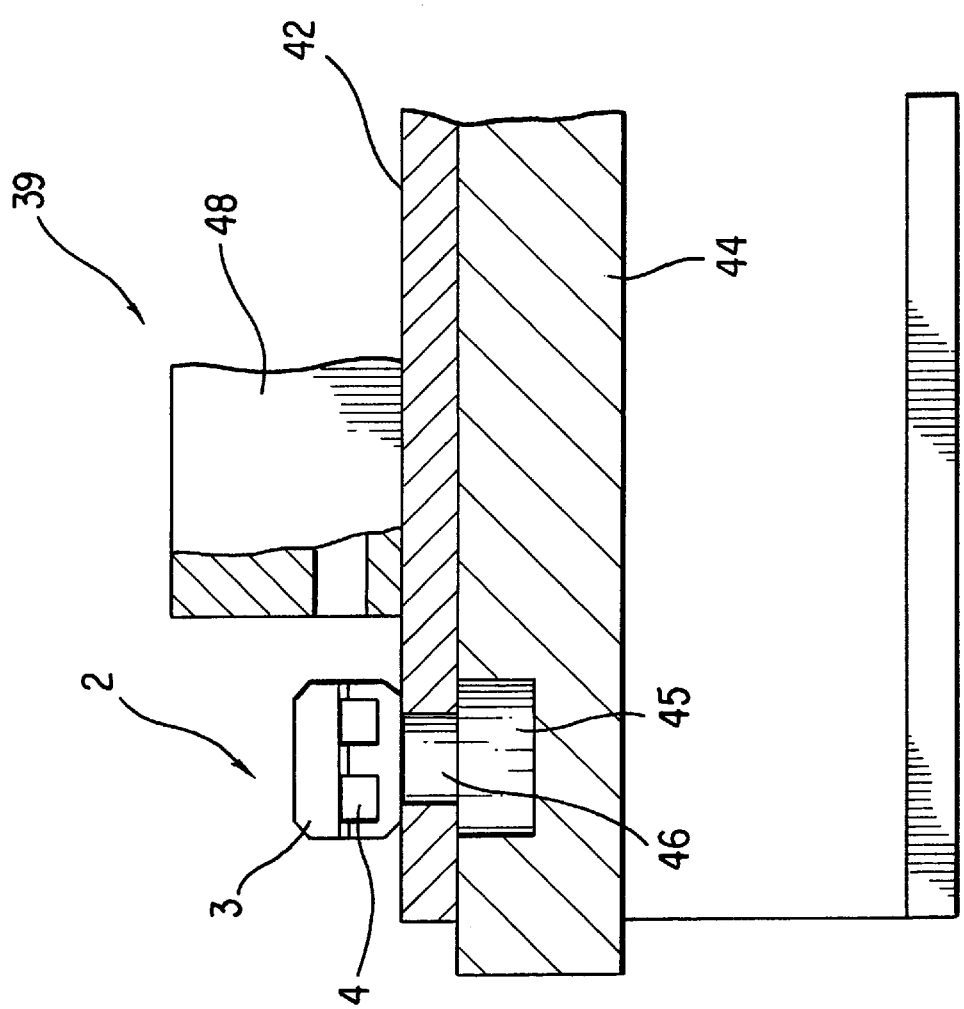
FIG. 3 shows in a simplified partial representation a section along line I-1 of FIG. 2.

In the figures, the back end machine for processing of electrical components 2, for example SMDs, is labelled 1, the components being for example transistors, and each component having plastic housing 3 and on two opposing sides of this housing leads 4 which project radially.

In terms of fundamental structure machine 1 consists essentially of feed unit 5 to which components 2 as lead frame 6 are supplied (conveyor direction V) and its important component is punch-out and positioning means 7. With this device 7 which is detailed below, components 2 are punched out of lead frame 6 and relayed in a given orientation to transport system 8 which has a plurality of vacuum chucks 9 for holding one component 2 at a time. With transport system 8 components 2 in transport direction T1 of this system are moved past several working and test stations, for example, bending station 10, measurement station 11, buffer station 12 and finally they reach station 13 for sorting of components 2 as loose material or for forming batches in different shafts according to measured electrical vales or one of belt stations 13' for belting of components 2, on belt station 13' in turn according to the measured values obtained on measurement stations 11 components 2 of one batch from a belt being belted. On transport system 8 which is made as a longitudinal conveyor or inline conveyor there is furthermore also one station 14 on which components 2 are turned around a vertical axis, by a given angular range, for example by an angular range of 90 degrees or 180 degrees. Station 14 is hereinafter also called the "turning station".

Transport system 8:

As can be taken from FIGS. 1 and 2, transport system 8 consists essentially of endlessly revolving steel belt 15 which is located on edge, i.e. with its surface sides in the vertical plane, and is guided via two deflection wheels 16. On the outside of the loop formed by steel belt 15 several successive pads 17 are attached. On each pad 17 there are two vacuum pipettes or vacuum chucks 9 which can move in the vertical direction. Each chuck 9 is prestressed to the top by spring 18. Chucks 9 are controlled by stationary guide cam 19. Along the conveyor section between feed unit 9 and belt stations 13' is steel belt 15 with the inner side of the loop against guide strip 20 with vacuum channel 21 with which each vacuum chuck 9 is connected via pertinent opening 22 in steel belt 15 and a corresponding channel in pad 17.

Punch-out and positioning device 7:

This punch-out and positioning device 7 consists essentially of the following components:

Device 23 for feed of lead frame 6. This device is built such that it very precisely enables stepped feed and relay of lead frame 6 (in conveyor direction V) even in steps of different sizes. Feed means 23 for this reason has motorized advance 24 which is controlled by central control means 25 according to input or programming on input unit 26 on which then for example only the type of lead frame 6 or a code which identifies this lead frame 6 or its type is input.

Lead frame 6 has two edge regions 6' which each have a perforation formed by a plurality of holes 6" so that exact feed is possible. Furthermore, lead frame 6 is made as a quadruple lead frame, i.e. on this lead frame are components 2 in four rows which each extend in the longitudinal direction of the lead frame, of which in the figures two adjacent rows labeled A form a first group and two adjacent rows labeled B form a second group. Component 2 of each row A and B is in the transverse direction of the lead frame, i.e. in the axial direction perpendicular to conveyor direction V and to the lead frame longitudinal axis coaxially with components 2 of the other rows.

Figure 5:
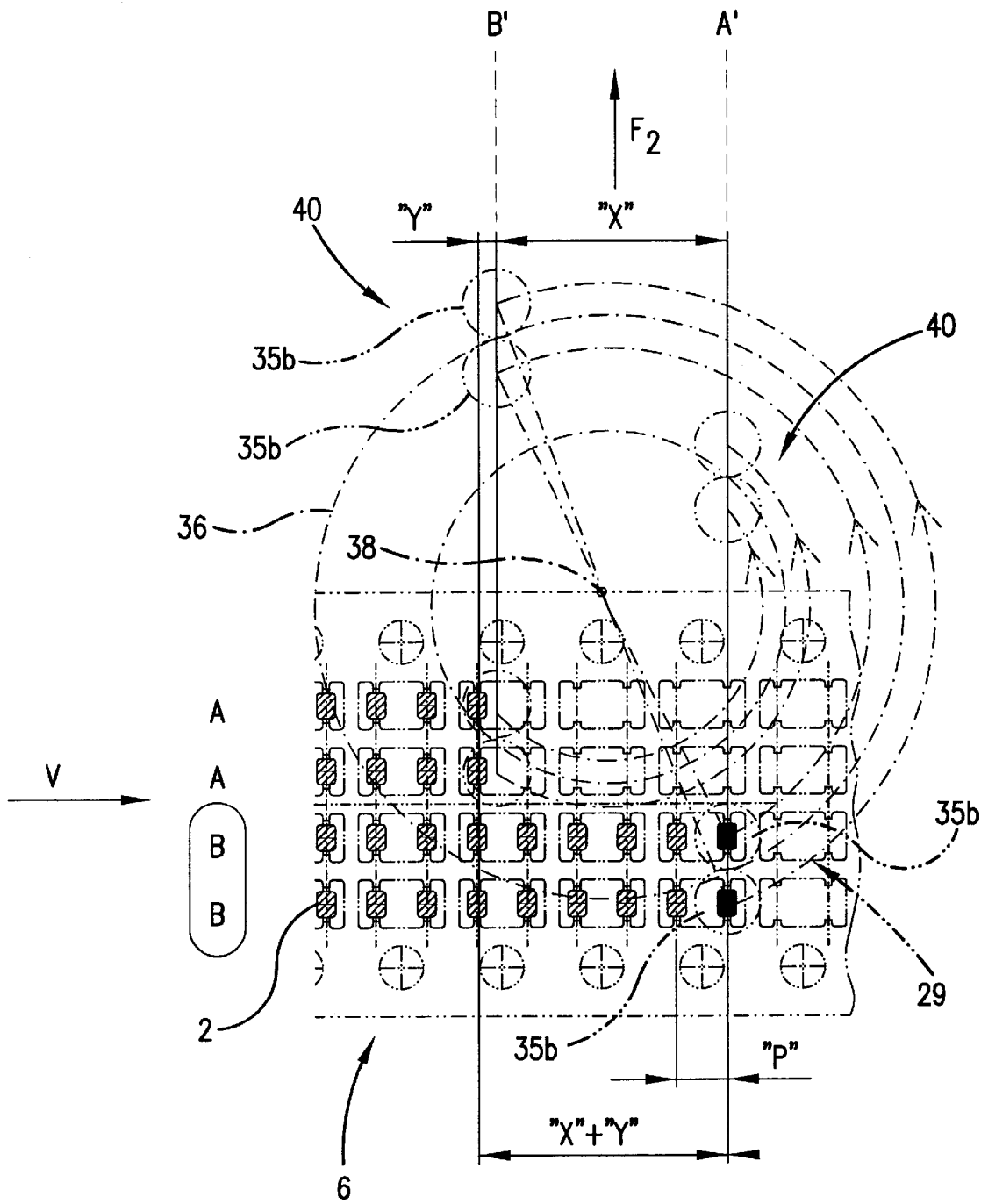
FIGS. 5–8 show in a simplified representation and in an overhead view the transfer plate of the punch-out and positioning device.

In FIG. 5ff "P" labels the grid dimension or the distance at which components 2 in each row A and B follow one another in the lead frame longitudinal direction. In these Figures "X" labels the grid dimension or the distance which corresponds to the axial distance of two vacuum chucks 9 which follow one another on transport system 8 or receiving areas formed there on the bottom of chuck 9. As furthermore shown in FIG. 5ff, distance X is not an integral multiple of distance P. Rather, in this embodiment it holds that distance X is equal to five times distance P minus the difference of lengths Y, i.e. X=5 P–Y.

In FIG. 5ff. "D" labels the axial distance of components 2 of two adjacent rows A, B perpendicular to the lead frame longitudinal direction from one another.

Figure 6:
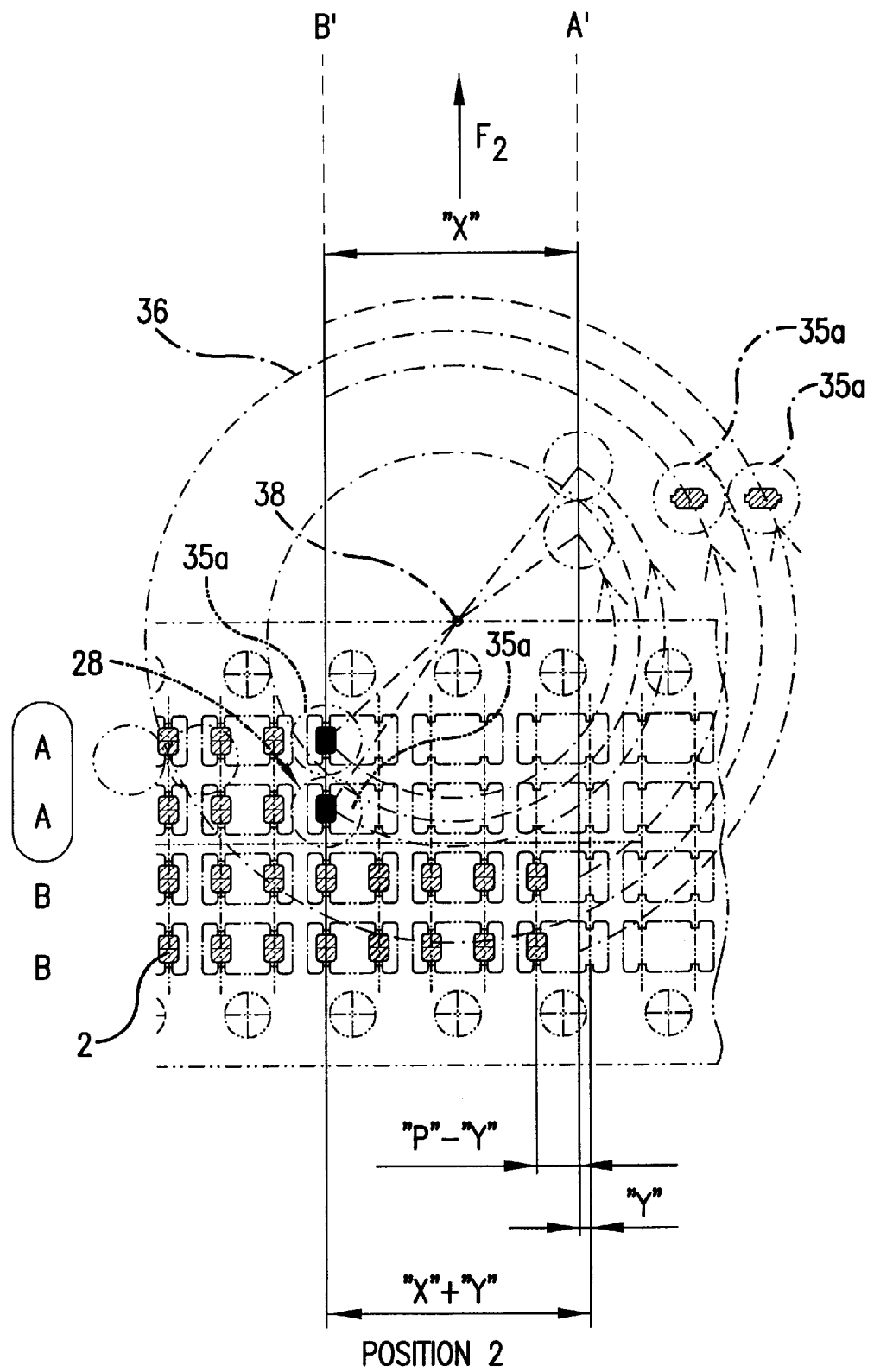

Another important component of device 7 is cutting station 27 on which punching of components 2 out of lead frame 6 from underneath takes place such that in the conventional manner on each component 2 parts of the bridges of lead frame 6 remain as leads 4. The cutting station has two cutting positions 28 and 29 which are offset in advance direction V of lead frame 6 at distance X against one another, specifically one cutting position 28 for two components 2 of two rows A adjacent in the transverse direction of the lead frame and (following in advance direction V) cutting position 29 for two components 2 of two rows B located next to one another in the transverse direction of the lead frame (for example, FIGS. 5 and 6).

Figure 4:
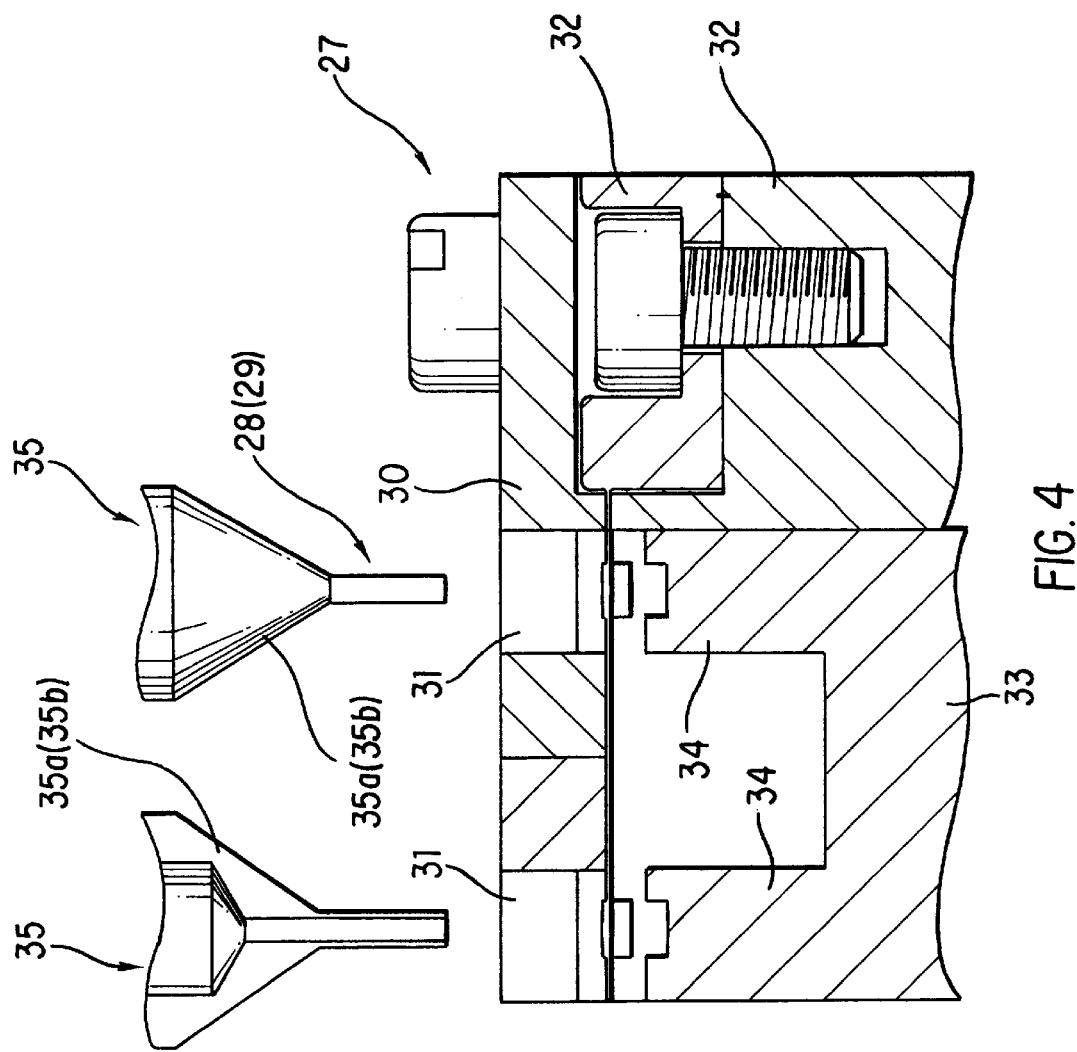
FIG. 4 shows in a simplified partial representation and in a partial section the cutting and punching station of the device.

The design of cutting device 27 on two cutting positions 28 and 29 is detailed in FIG. 4. The cutting or punching tool at these cutting positions consists of upper, plate-shaped die 30 which has two die openings 31 transversely to conveyor direction V, two clamp elements 32 which can be moved up and down in the vertical direction, which are provided on the two longitudinal sides of lead frame 6, and of which in FIG. 4 only one is shown, and tool part 33 which can be moved up and down in the vertical direction and which forms two clipping punches 34 which interwork with die opening 31.

For punching out one pair of components 2 of two rows A or B at a time lead frame 6 is advanced such that these two components 2 to be punched are then located at pertinent cutting position 28 or 29, i.e. centered on die opening 31. Subsequently, by activation of clamp elements 32 the lead frame is fixed and then by activation of tool 33 two components 2 are punched out. Before activation of tool 33 each component 2 is held by vacuum chuck 35 which extends from overhead through die opening 31 and which moves upward in the vertical direction when the pertinent component is punched out and holds component 2 even after punching out in a given orientation and is moved away from cutting position 28 and 29. Vacuum chucks 35 are a component of transfer plate 36 which is detailed below. Vacuum chucks 35 are provided there in pairs.

Furthermore, cutting station 27 is made such that one pair of components 2 of two rows A is punched out at cutting position 28 separately in time from punching out of components 2 of the pair of two rows B on cutting position 29 and vice versa, i.e. in each cycle of operation of device 7 or cutting station 27 and transfer plate 36 which operates synchronously with this cutting station, two components 2 at a time are punched out alternately on cutting position 28 or on cutting position 29.

Transfer plate 36 can be turned by means of drive 37 around a vertical axis, this drive which is controlled in turn by central control means 25, enabling precise stopping or positioning of transfer plate 36 in for example positions stipulated by a control program.

On transfer plate 36 in the embodiments shown there are a total of four pairs of vacuum chucks 35, specifically the vacuum chucks which are located radially further to the inside relative to vertical axis of rotation 38 and which are labelled 35a in FIG. 5ff, and the vacuum chucks which are located radially further to the outside and which are labelled 35b in these figures. Vacuum chucks 35a are assigned to cutting position 28 or one die opening 31 there at a time and vacuum chucks 35b to cutting position 29 or die opening 31 there.

In the embodiment shown the two pairs of vacuum chucks 35a and also two pairs of vacuum chucks 35b are each offset against one another by 180 degrees relative to axis of rotation 38. Transfer plate 36 which is turned in steps or clocked interacts with following sorting and transfer section 39 which is made as a linear conveyor and which has horizontal conveyor direction F2 which is oriented perpendicular to advance direction V. Sorting and transfer section 39 forms two conveyor regions A', B' which extend parallel to one another in conveyor direction F2 and perpendicular to conveyor direction F2 have distance X. Each conveyor region A', B' has feed position 40 where in normal operation two components 2 at a time are deposited using two vacuum chucks 35 provided on transfer plate 36 in conveyor direction F2 following one another, specifically on conveyor region A' two adjacent components 2 of two rows A and on conveyor region B' two adjacent components 2 of two rows B of lead frame 6. Each conveyor region A' and B' furthermore has removal position 41 on transport system 8, removal positions 41 of conveyor regions A' and B' being offset against one another in conveyor direction F1, such that components 2 ready at removal positions 41 of two conveyor regions A' and B' are picked up at the same time by two vacuum chucks 9 which follow one another in conveyor direction F1.

Figure 7:
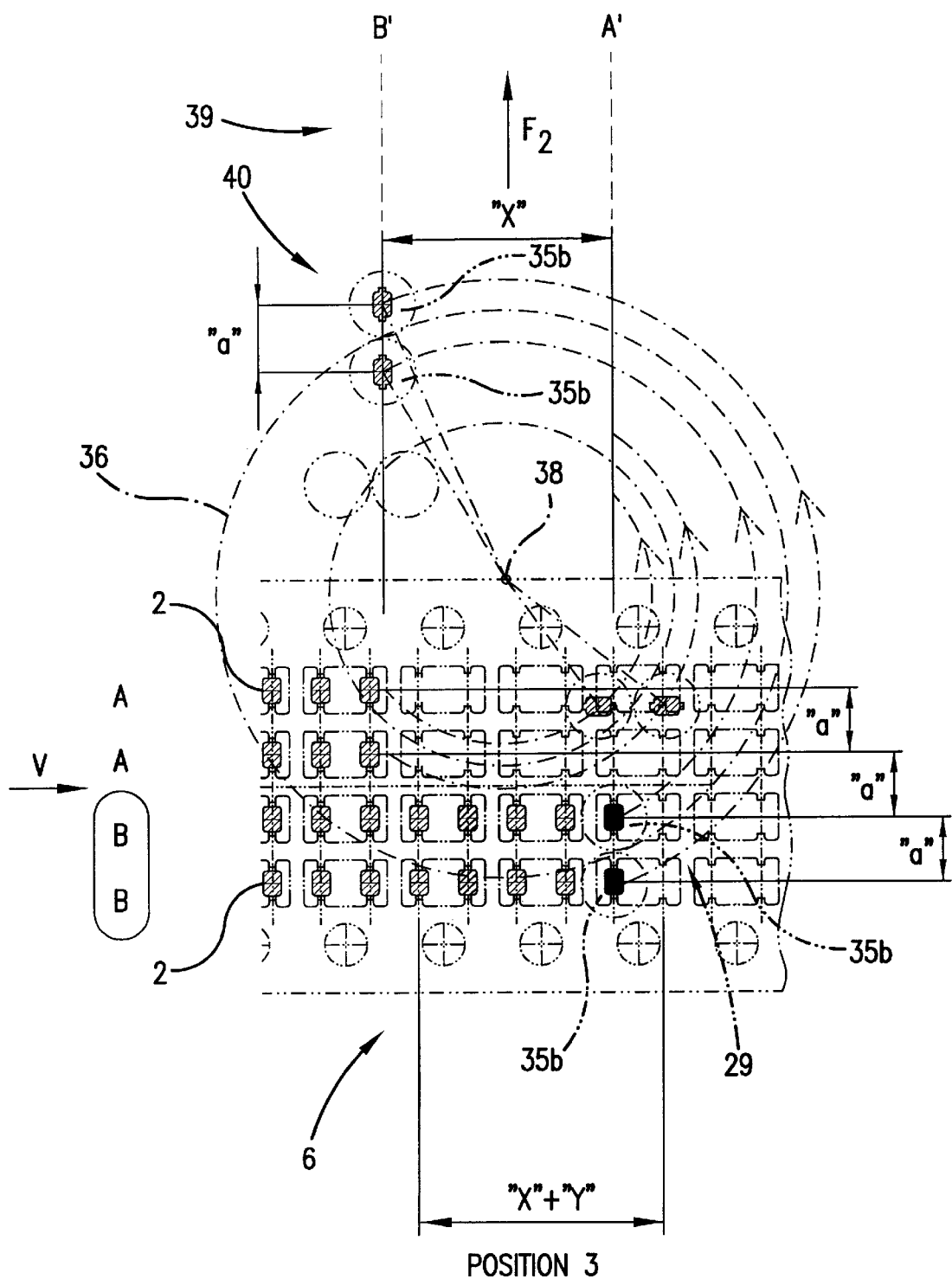
Figure 8:
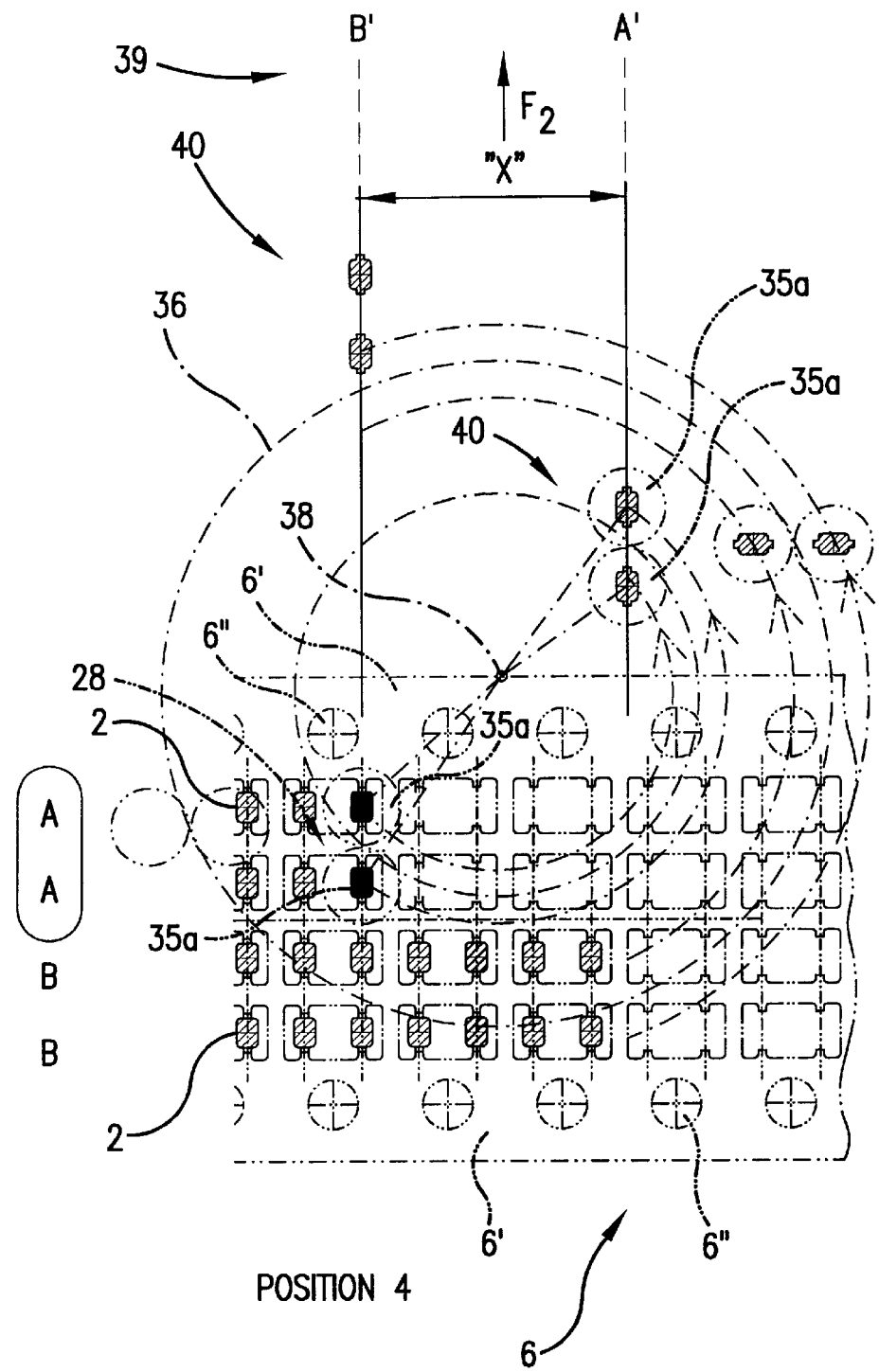

Transfer plate 36 which is driven clocked around axis of rotation 38 has a total of four rest positions in the embodiment shown, specifically:

position 1 (FIG. 5):

In this position are a first pair of vacuum chucks 35b on cutting position 29 and a second pair of vacuum chucks 35b on feed position 40 of conveyor region B';

position 2 (FIG. 6):

In this position are a first pair of vacuum chucks 35b on cutting position 28 and a second pair of vacuum chucks 35a on feed position 40 of conveyor region A';

position 3 (FIG. 7):

In this position are a second pair of vacuum chucks 35b on cutting position 29 and a first pair of vacuum chucks 35b on feed position 40 of conveyor region B';

position 4 (FIG. 8):

In this position are a second pair of vacuum chucks 35a on cutting position 28 and a first pair of vacuum chucks 35a on feed position 40 of conveyor region A'.

Sorting and transfer section 39 in the embodiment shown consists essentially of endless steel belt 42 which is driven peripherally and which is guided via deflection rollers or wheels 43, which can be turned around a horizontal axis and of which at least one deflection wheel is driven. Steel belt 42 forms an upper horizontal length with which this steel belt lies on guide body 44, specifically with the inner side of the loop. In guide body 44 are two grooves 45 which are open to the flat horizontal top and which are closed on the bottom, on the two longitudinal sides and on the two ends. One groove 45 at a time is located under one of conveyor region A' and B'.

In steel belt 42, for each conveyor region A' and B' there is a plurality of openings 46 which follow one another at given distances and which have a cross section which is less than the area of the bottom of housing 3 of components 2. Grooves 45 which are covered by steel belt 42 on the top of guide body 44 are joined to a source which is not shown for a vacuum or negative pressure. Each opening 46 forms a receiving region for component 2 which then is held on this opening 46 by negative pressure in respective groove 45 and thus is carried with steel belt 42 in conveyor direction 42 from respective feed position 40 to removal position 41. Components 2 in their orientation are fixed by negative pressure.

Drive 47 drives steel belt 42 via one of deflection wheels 43 by control means 25 clocked such that whenever two components 2 with two vacuum chucks 35a have been deposited on two receiving areas 46 of conveyor region A' and also two other components 2 in a subsequent cycle by vacuum chucks 35b on two receiving areas 46 of conveyor region B', steel belt 42 is moved on by a length in conveyor direction F2 which corresponds to the distance of two receiving regions 46 so that then at feed position 40 of two conveyor regions A' and B' in turn two empty receiving areas 46 are ready.

On the conveyor section between feed position 40 and removal position 41 there is blowoff means 48 with which faulty and/or incorrectly oriented components can be blown off from two sides. As indicated by 48', the blowoff means is formed by a strip which extends over a greater length of the conveyor section formed by belt 42 and is used as a hold-down from this belt.

Components 2 at removal position 41 can be removed especially easily from sorting and transfer section 39 by vacuum chucks 9 of transport system 8.

Device 7 has the advantage that same back end machine 1 can be used for most varied lead frames 6 and in this regard especially also distance P which components 2 in the longitudinal direction of the lead frame have from one another can vary within wide ranges. Simply by corresponding control of advance V for lead frame 6 is respective distance P taken into account, for example using software. Furthermore device 7 can also be triggered and/or made such that lead frames 6 can also be processed with only two rows or with four rows of components 2, but also with a number of rows different therefrom. Device 7 is controlled such that components 2 of row A reach only conveyor region A' and components 2 of row B reach only conveyor region B'.

Buffer section 12

FIG. 11 in a simplified cross section shows buffer section 12. It consists of disk-shaped transport wheel 49 which can be driven around the vertical axis and which on the periphery has a plurality of openings 50 which are easily made in openings 46 and which form receiving areas for one component 2 at a time.

Under openings 50 which are provided at uniform angular intervals, in disk-shaped guide body 52 which adjoins the transport wheel made as a thin disk, annular vacuum channel 51 is formed which in turn is made groove-shaped and on the top is covered by transport wheel 49. Transport wheel 49 is located underneath the path of motion of vacuum chucks 9 of transport system 8 and in the embodiment shown such that this path of motion diagonally intersects.

Components 2 are inserted into buffer section 12 by their being deposited on one side of the buffer section each time by lowering vacuum chucks 9 in succession onto receiving areas 50. On the opposite side components 2 are then removed again from the buffer section by likewise lowered vacuum chucks 9 in succession.

In this buffer section, by combination of vacuum chucks 9 on transport system 8 of the receiving areas formed by openings 50 with vacuum fixing of components 2, especially simple and reliable transfer of components 2 from one transport element, specifically from vacuum chucks 9, to the other transport element, specifically to transport wheel 49, and vice versa, is possible without other mechanical aids.

Figure 12:
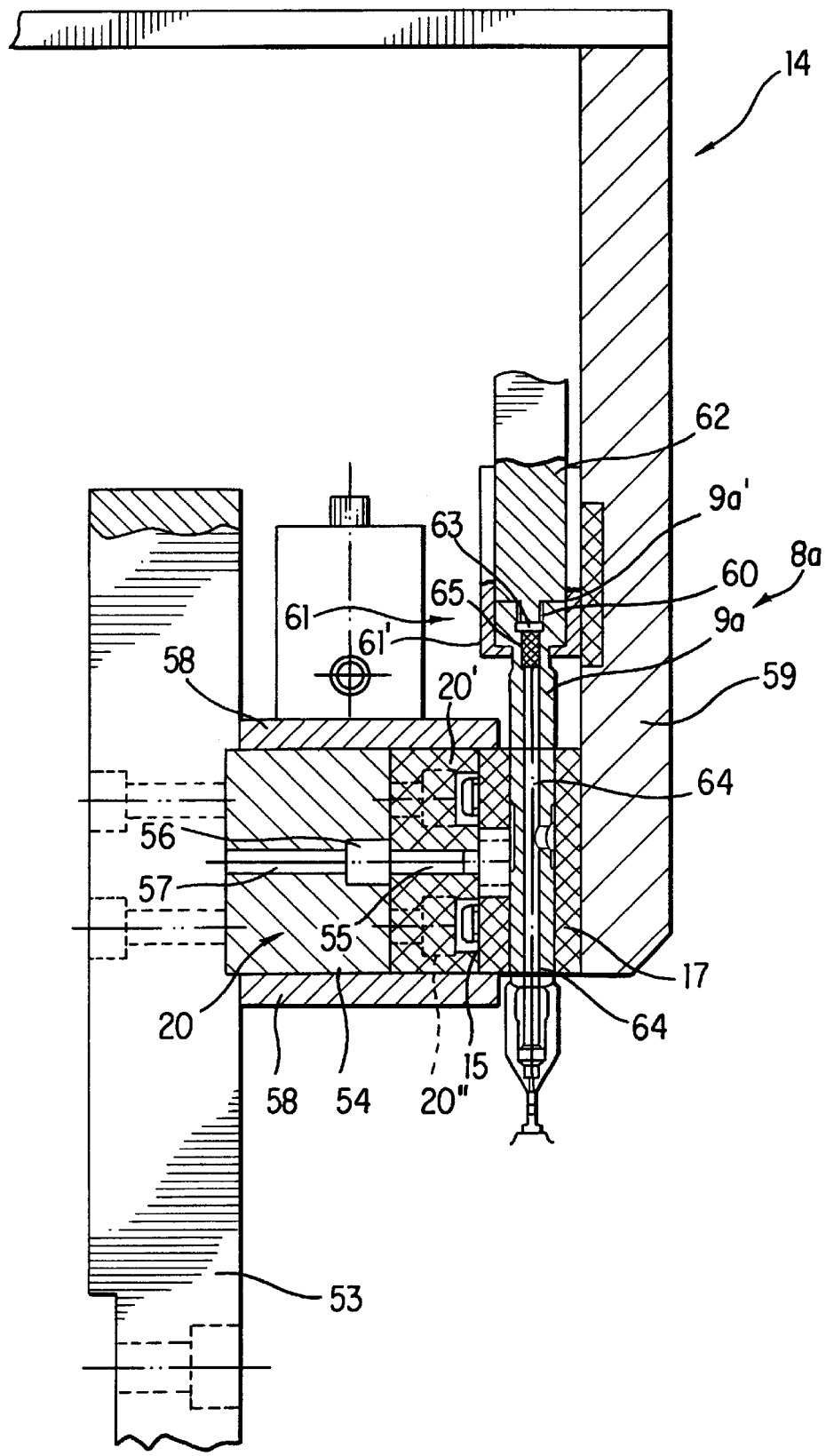
FIG. 12 shows in an individual representation a section similar to FIG. 10 through a transport system made as a longitudinal conveyor or inline conveyor in the area of a station for turning the components.

Turning station 14:

FIG. 12 again shows in a section transport system 8a which corresponds in its basic structure to transport system 8, but does have certain differences which will be detailed below. FIG. 12 among others shows vertical support element 53 (for example, a plate) which is a component of a machine frame which is otherwise not detailed and to which is attached horizontal support strip 54 which extends in the transport direction of transport system 8a, i.e. perpendicular to the plane of the drawing of FIG. 12, and which supports guide strip 20 which is made of plastic. The guide strip is made in two parts and consists of upper individual strip 20' and lower individual strip 20" which are attached parallel to one another and at a distance from one another to support strip 54 so that between the two strips slot 55 is formed which has the function of vacuum channel 21 and ends in vacuum distributor channel 56 which is connected via at least one channel 57 to a vacuum source. As a transport element in turn there is continuous steel belt 15 to which retaining pads 17 are attached. To achieve guidance in the vertical axial direction there are two guide plates 58 which extend likewise over the entire length of guide 20 and are attached top and bottom to support strip 54 such that each guide plate 58 with one edge area overlaps upper and lower strip 20' and 20" and also projects somewhat above the guide surface of guide 20 so that steel belt 15 and also pads 17 top and bottom are each guided on guide plate 58. Pads 17 are likewise made of plastic. Opposite guide 20 is a counterstay formed by plate 59.

In pads 17 in turn vacuum pits or vacuum chucks 9a can be moved vertically and can turn around their vertical axis. Vacuum chucks 9a differ from vacuum chucks 9 essentially in that on the top of widened head 9a' there is slot 60. This is made as a slotted cross.

Figure 13:
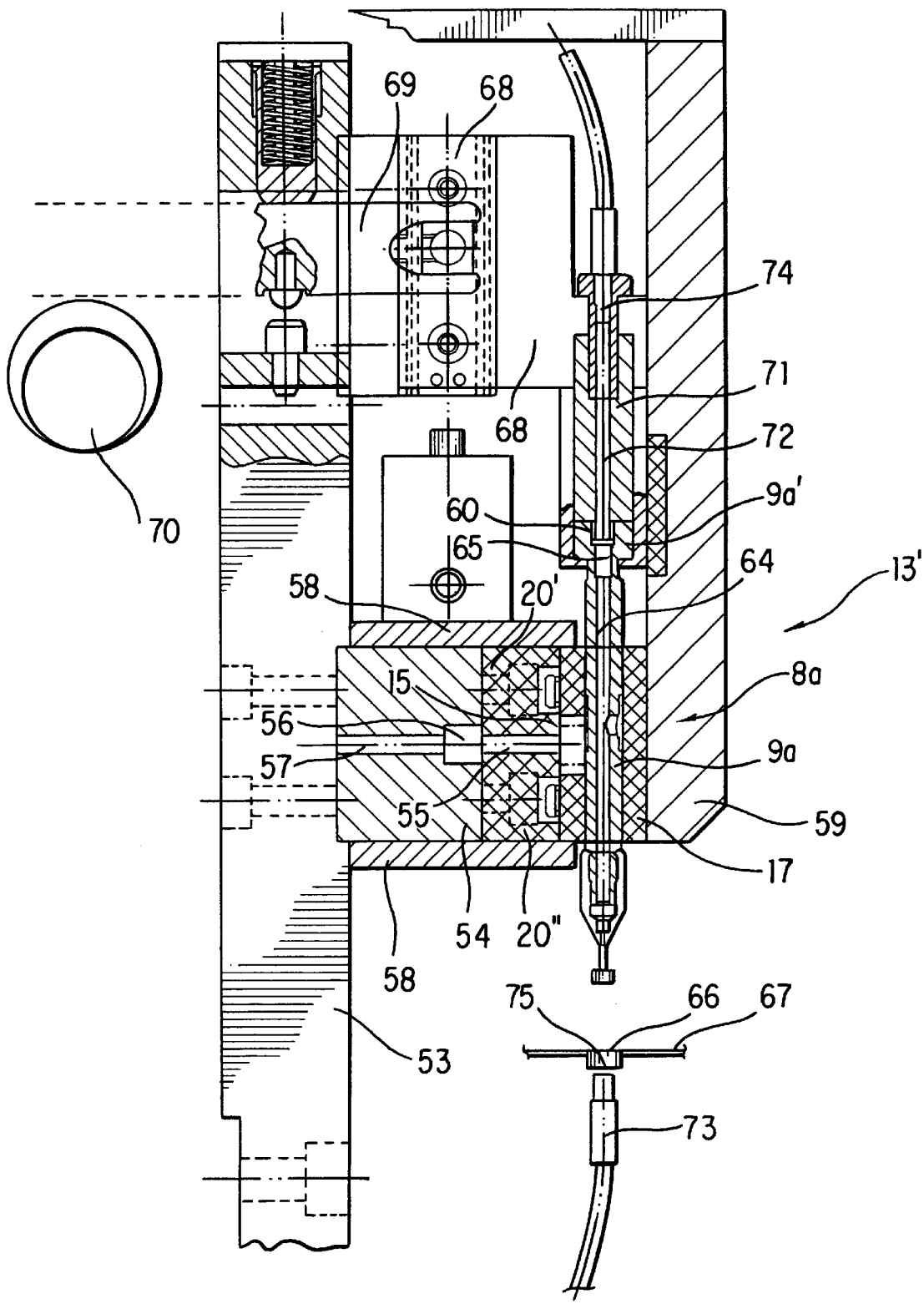
FIG. 13 shows a view as in FIG. 12, but in the area of a belt station for inserting the respective components into a small cup formed beforehand in the belt.

Transport section 8a furthermore has upper guide 61 which fits behind vacuum chuck 9a on the bottom of head 9a'. This guide consists of fixed segments 61' which are provided where vacuum chucks 9a are to have a certain vertical position, i.e. are located for example in the raised position. Guide 61 furthermore has movable segments 61" which are provided where vertical motion of the vacuum chucks is necessary, for example, on the above described at bending station 10, at measurement station 11, at buffer station 12, at the transfer to receiving area 13, at belt station 13' which is shown in FIG. 13 and detailed below, and also at removal station 41.

At turning station 14 guide 61 is formed by fixed segment 61'. At this station, there is live spindle 62 which can be rotated by a drive which is not shown around the vertical axis of vacuum chuck 9a which is moving past, which can be moved in the vertical direction above the path of motion of heads 9a', and which after its lowering with screwdriver-like driver 63 fits into slot 60 of respective vacuum chuck 9a which is located underneath spindle 62 and then turns vacuum chuck 9a via a drive which is not shown around the vertical axis by a given angular amount.

To prevent undesirable twisting of vacuum chuck 9a as it moves along the transport section, preferably above guide 61 there is an additional guide which on the bottom has a strip-like projection which corresponds to driver 63 and which fits into slot 61 of heads 9' where there is no spindle 62 with its driver 63. Since slot 60 is made as a slotted cross with two individual slots which intersect at an angle of 90 degrees, further motion of vacuum chuck 9a is possible along the conveyor section even after rotation by 90 degrees or a multiple thereof.

One special features of transport section 8a is that vacuum chucks 9a have vacuum channel 64 which extends from the top of head 9a' to the pipette-shaped lower end of each vacuum chuck and that this channel 64 on the top is sealed by insert 65 of a transparent or translucent material, for example, acrylic glass.

Belt station 13':

FIG. 13 shows belt station 13' on transport section 8a. At this belt station components 2 are inserted by lowering respective vacuum chuck 9a into cup 66 of belt 67, said cup standing ready under this vacuum chuck, specifically one component 2 at a time into one of the cups which are provided in succession on belt 67. For this reason on belt station 13' there is segment 61" of guide 61, specifically on slide 68 which can move in the vertical direction and which is moved away via control lever or rocker 69 by central camshaft 70 which extends over the entire length of the machine, which drives still other stations of the machine and which is driven synchronously with the drive for that of steel belt 15. Via slide 68, segment 61" of guide 61 and also upper ram element 71 which fits into slot 60 and which adjoins the top of head 9a is moved up and down. Preferably there is segment 61" on slide 68 and ram 71 is sprung so that when segment 61" moves down ram 71 is moved at the same time by the action of the spring down and when segment 61" moves upward, follows this. In ram 71 there is channel 72 which forms the continuation of channel 64 there for vacuum chuck 9a which is located on belt station 13'. Two channels 64 and 72 are a component of a light path between a light-emitting element 73 (for example IR light emitting diode) and light detector 64. In the embodiment shown there is element 73 under the path of motion of belt 67 such that in cup 66 which is ready on belt station 13' and vacuum chuck 9a the axis of the light beam emerging from element 73 is coaxial with the axes of channels 64 and 72 and this light beam can pass through opening 75 in the bottom of respective cup 66. Light detector 74 is located on the top end of ram 71.

As long as component 2 is on vacuum chuck 9a, the light path is interrupted. If after inserting component 2 into belt 67 the latter is moved on by one division, the light sent by element 73 can strike element 74. With these two signals, monitoring of the insertion of components 2 into belt 67 which precludes an error is possible.

It goes without saying that the monitoring section formed by elements 73 and 74 can also be provided on other areas of transport section 8 or 8a.

Figure 9:
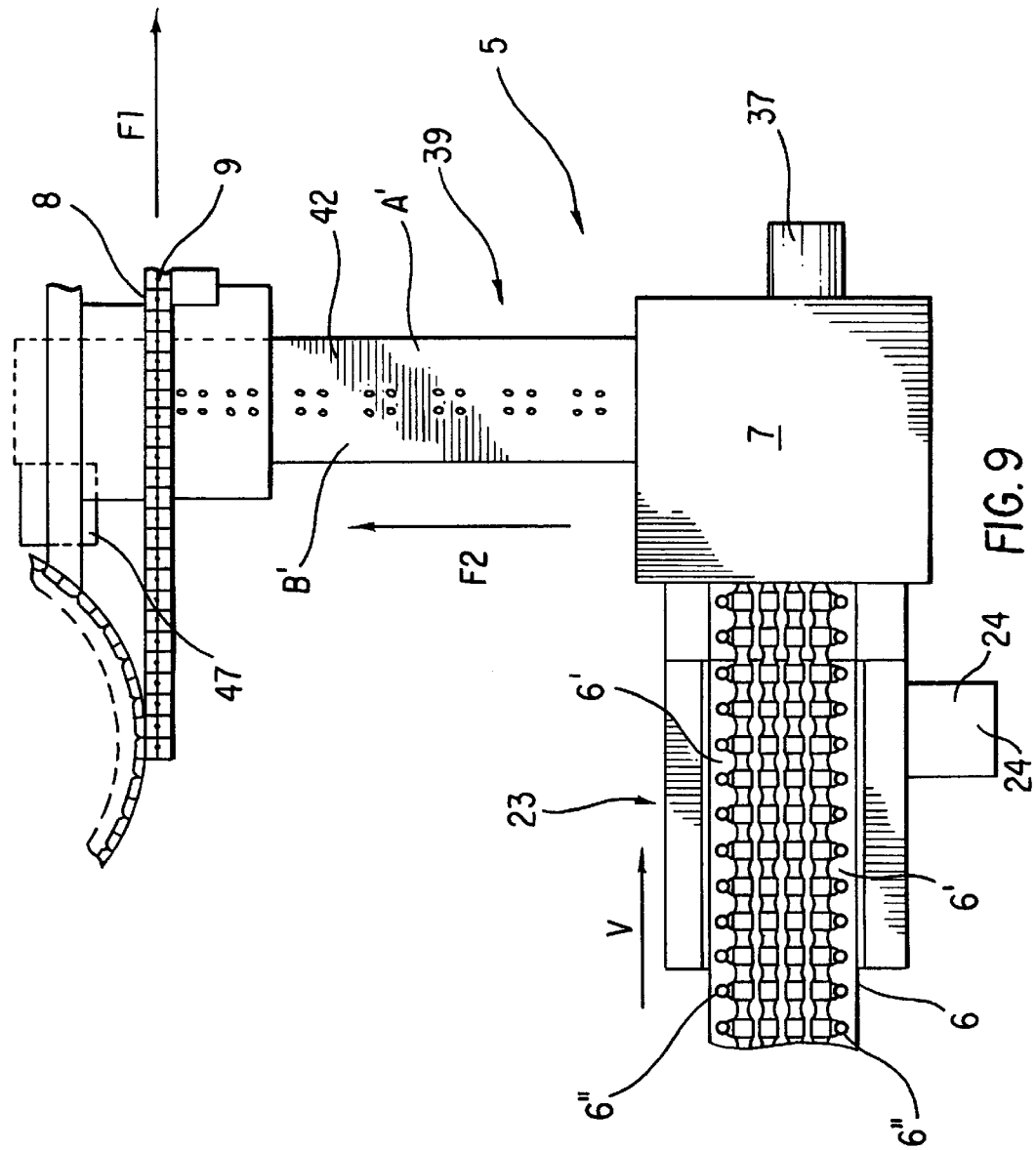
FIG. 9 shows in an enlarged representation and in an overhead view the lead frame feed, the punch-out device and the following transport means.
Figure 10:
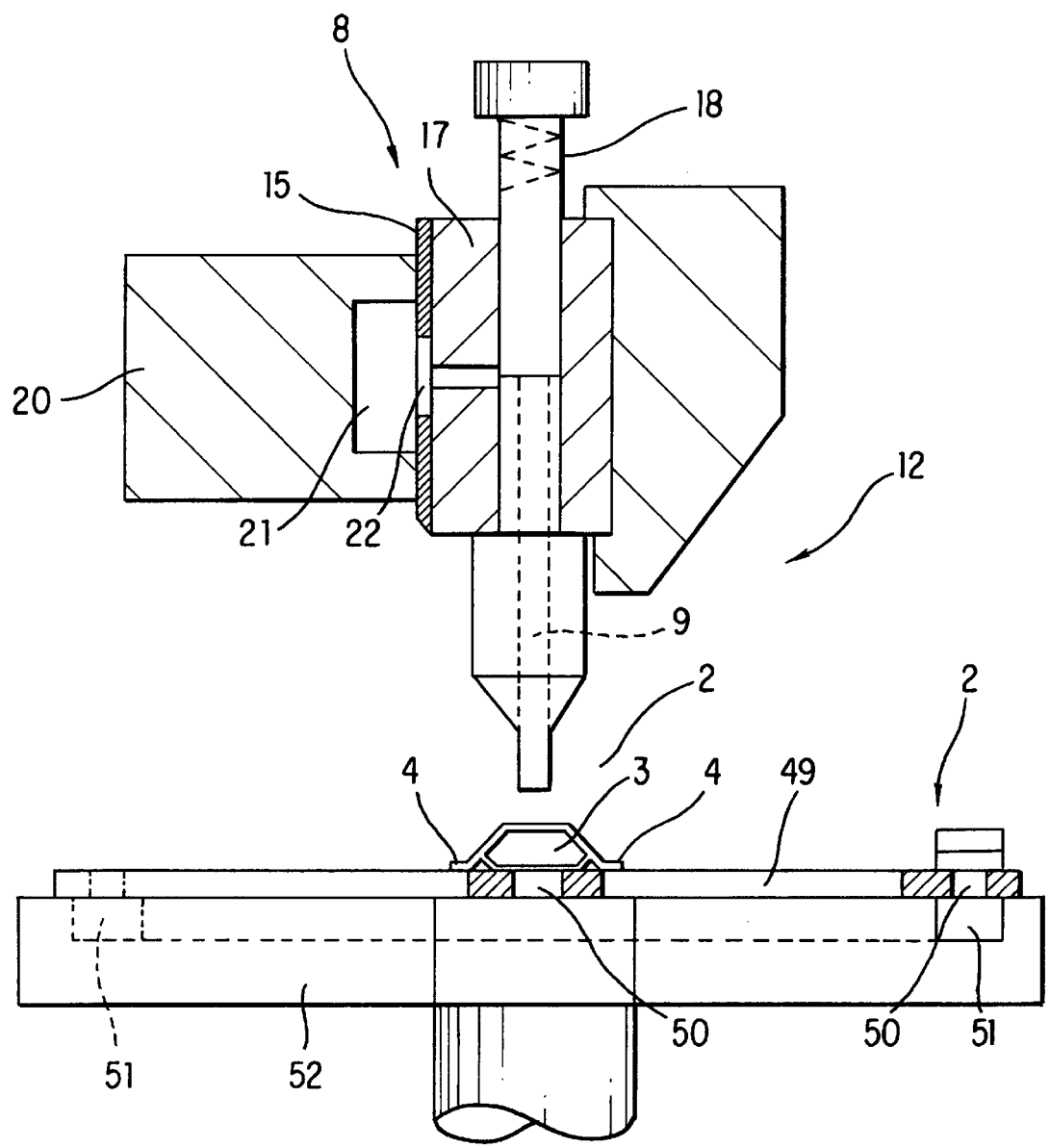
FIG. 10 shows in a simplified representation and in cross section a buffer station.
Figure 14:
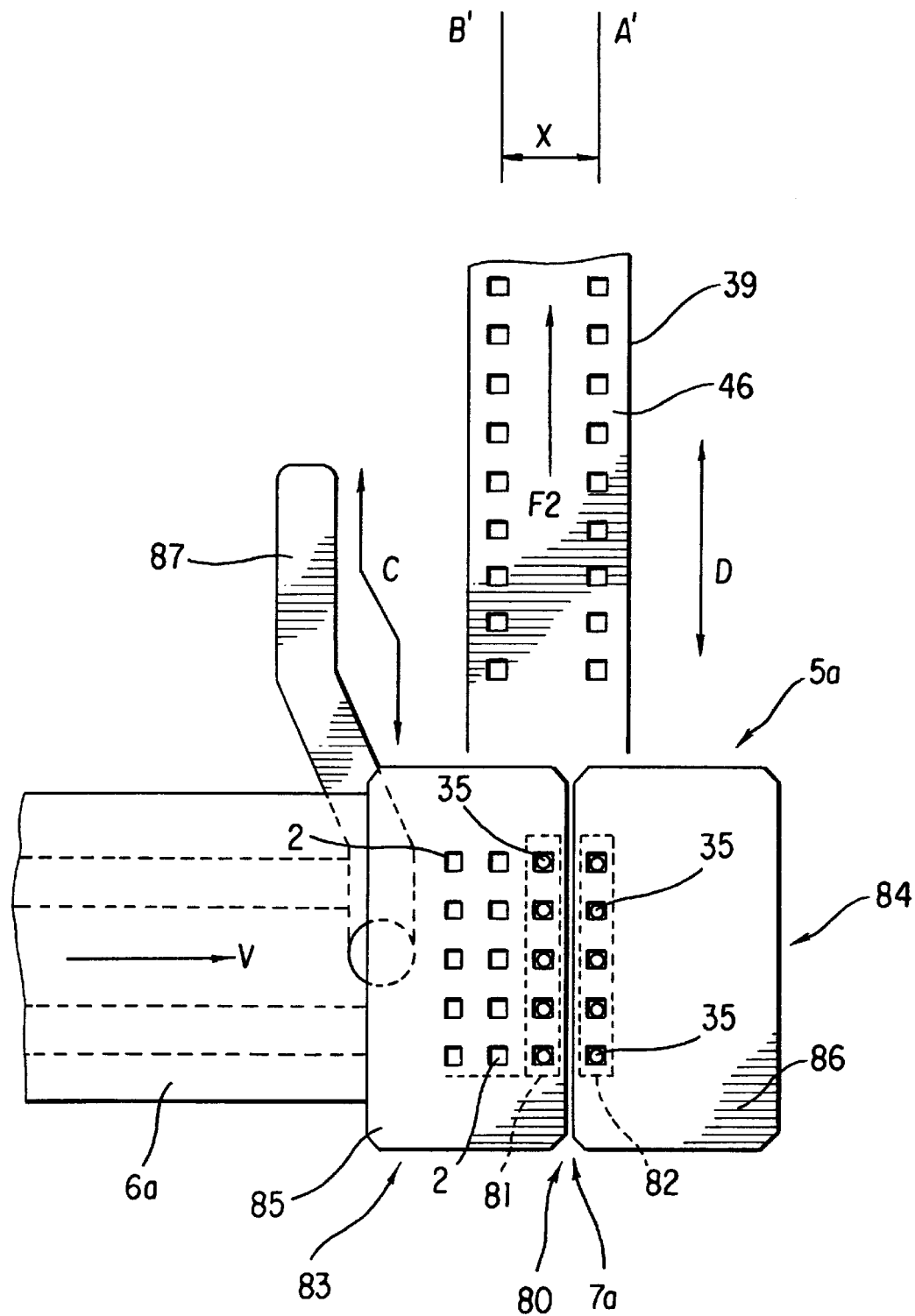
FIG. 14 shows in a very simplified representation and in an overhead view the lead frame feed, the punch-out device and the subsequent transport means in another embodiment of the invention.

FIG. 14 shows as another possible embodiment in one view similarly to FIG. 9 feed unit 5a for lead frame 6a, the pertinent punch-out and positioning device 7a and subsequent transfer section 39.

Lead frame 6a in the embodiment shown in FIG. 14 is made such that there are components 2 there in five rows in the lead frame longitudinal direction or advance direction V, i.e. transversely to the longitudinal direction of the lead frame five components 2 at a time adjoin one another.

Punch-out and positioning device 7a similarly to punch-out device 7 has a punching tool with which components 2 on the cutting station or at cutting position 80 are punched out of lead frame 6a which has been moved forward in steps, again from underneath with a corresponding punching tool. The special feature consists in that in each cycle all components 2 of two groups 81 and 82, which are adjacent to one another in advance direction V and which run transversely to advance direction V, are punched out at the same time, i.e. in the embodiment shown a total of ten components 2 at the same time. All components of group 81 are then moved jointly with transfer means 83 to corresponding receiving areas 46 of row B' and all components of group 82 with transfer means 84 jointly onto corresponding receiving areas 46 of row A'. Each transfer means 83 and 84 for this reason has a plurality of vacuum chucks 35, i.e. in the embodiment shown five vacuum chucks 35 at a time which are arranged in a line perpendicular to the longitudinal extension or advance direction V of lead frame 6 and at an axial distance which is equal to the distance which components 2 in each group 81 or 82 have from one another. There are vacuum chucks 35 on slide 85 (transfer means 83) or on slide 86 (transfer means 84). These slides are located above the plane of lead frame 6a and are guided on guides in planes parallel to the plane of lead frame 6a and can be moved by a drive in this plane and transversely to advance direction V, as is shown in FIG. 14 with double arrow C for transfer means 83 or its slide 85 and with double arrow D for transfer means 84 or its slide 86.

To achieve the spreading necessary for further processing of components or for machine distance X (increase of the distance) between groups 81 and 82, in the embodiment of one of the two slides shown in FIG. 14, specifically slide 85 of transfer means 83, is guided by cam control 87 such that for each stroke out of the initial position via lead frame 6a or via cutting position 80 into the transfer position via transfer section 39, it executes motion perpendicular to conveyor direction V and at the same time also lateral motion in one axis parallel to conveyor direction V, so that punched components 2 of group 81 which are carried with transfer means 83 are deposited on the transfer section in row B' which has distance X from row A'. Distance X is greater than the distance which one component 2 of group 81 at a time has from component 2 of group 82 in the longitudinal direction of the lead frame. In the transfer position vacuum chucks 35 of transfer means 83 and 84 are located over receiving area 46 of rows A' and B'.

Slide 86 of transfer means 84 is moved linearly in the embodiment shown, i.e. in the plane parallel to lead frame 6a and perpendicular to advance direction V, such that in the transfer position of transfer means 84 components 2 held on vacuum chucks 35 of this transfer means are deposited on free receiving areas of row A' of transfer section 39.

The advantage of the embodiment of FIG. 14 consists among others in that transfer of a plurality of components 2, i.e. in the embodiment shown of a total of ten components 2 in one stroke from lead frame 6a to transfer section 39 is possible and thus among others high performance can be achieved at a given working speed of feed unit 5a.

Feed unit 5a is especially suited for processing of lead frame 6a which have a large number of rows of components. These lead frames have among others the advantage that relative to the number of components 2 considerable material can be saved, especially with respect to the material of the lead frame and mainly also with respect to the material required for the housing of components 2 in so-called "molding", i.e. the material which is required in the molds of the housing of components 2. Furthermore, a lead frame with a large number of rows of components in the longitudinal direction also offers the advantage of improved quality, especially also in "molding".

Reference number list
1 back end machine
2 component
3 plastic housing
4 lead
5, 5a feed unit
6, 6a lead frame
6' edge
6" perforation
7, 7a punch-out and positioning device
8, 8a transport section
9, 9a vacuum chuck
9a' head
10 bending station
11 measurement station
12 buffer station
13 receiving area
13' belt station
14 turning station
15 steel belt
16 deflection roller
17 pad
18 spring
19 control cam
20 guide rail
20', 20" individual strip
21 vacuum channel
22 opening
23 lead frame feed
24 advance
25 control
26 input
27 cutting station
28, 29 cutting position
30 die
31 die opening
32 clamp means
33 tool
34 clipping punch
35, 35a, 35b vacuum chuck
36 transfer plate
37 drive
38 axis of rotation
39 sorting or transfer section
40 feed position
41 removal position
42 steel belt
43 deflection roller
44 guide
45 groove or vacuum channel
46 opening or receiving area
47 drive
48 blowoff means
49 transport plate
50 opening
51 vacuum channel
52 slide or guide body
53 support element
54 support strip
55 slot
56 distributor channel
57 connection channel
58 guide plate
59 plate
60 slot
61 guide
61', 61" segment
62 spindle
63 driver
64 vacuum channel
65 insert
66 cup
67 belt
68 slide
69 rocker
70 camshaft 71 ram
72 channel
73 light transmitter
74 light detector
75 opening
80 cutting position
81, 82 group
83, 84 transfer means
86, 86 slide
87 control cam

What is claimed is:

1. A device for processing small components, comprising:

at least a first transport element and second transport element, said transport elements each having a plurality of receiving areas for receiving and holding one component each, said transport elements forming a conveyor section with a transfer area, at which each component is transferred from the first to the second transport element, the receiving areas of said first of said transport elements being formed by vacuum chucks, said second of said transport elements being one of a belt or a transport wheel and having the receiving areas formed on openings in said belt or transport wheel, a guide having a guide surface and at least one vacuum channel on said guide surface, and said belt or transport wheel lying with a side opposite the receiving areas on said guide surface, moving relative to said guide surface and sealing the vacuum channel on said guide surface so that said openings in said belt or transport wheel form suction openings for holding the components on said receiving areas.

2. The device as claimed in claim 1, wherein transport belt or transport wheel has a flat horizontal bearing surface for components on the side facing away from guide.

3. The device as claimed in claim 1, wherein there are several receiving areas in at least one row on the transport elements in conveyor direction.

4. The device as claimed in claim 1, wherein at least two rows of receiving areas or two conveyor regions are formed on at least one transport element.

5. A device for processing small components arranged in several rows in a lead frame, in a system with lead frame fed means and with a cutting station forming at least one cutting position for cutting the components from the lead frame, said device comprising:

a transport system or conveyor section for relay of punched-out components from said at least one cutting position, said transport system being formed by at least a first transport element and a second transport element, said second transport element having at least two conveyor regions, each of said at least two conveyor sections being formed by a plurality of receiving areas for the components, said receiving areas of each conveyor section follow one another in a conveyor direction of the second transport element, said at least two conveyor regions have a first distance from another transversely to the conveyor direction, and means for controlling the lead frame feed means, the cutting station and at least the first transport element such that in working cycles of the device components are punched out of the lead frame and transferred by the at least one first transport element in part to first and in part to second conveyor region of the second transport element.

6. The device as claimed in claim 5, wherein a first distance between vacuum chucks is greater than a distance the components is lead frame have from one another.

7. The device as claimed in claim 5, wherein for processing of lead frames in which components are arranged in several rows which extend in the longitudinal direction of the lead frame, cutting station, advance of feed for lead frame and said at least first transport element can be controlled such that in one working cycle at a time components of two groups of components are punched out on at least one cutting position and are transferred from said at least first transport element to the one conveyor region of said second transport element assigned to the respective group and to receiving areas there, each group of components comprising at least two components which follow one another.

8. The device as claimed in claim 5, wherein components on lead frame are arranged in at least two groups of rows which extend each in advance direction, wherein cutting station for each group of rows forms cutting position, wherein cutting positions are offset against one another in advance direction and wherein advance of lead frame feeds, cutting station and at least first transport element can be controlled such that in one working cycle the components of one group of rows on cutting position assigned to this group are punched out as a component group and are relayed from at least first transport element to conveyor region of second transport element assigned to this group and to receiving areas there, and wherein in one subsequent working cycle components of a second group of rows are punched out as a component group on cutting position assigned to this group of rows and are relayed from at least first transport element to conveyor region of subsequent second transport element assigned to this second group of rows and to receiving areas there.

9. The device as claimed in claim 5, wherein in at least two groups of rows and in at least two rows per group each cutting position has two cutting tools, in each working cycle of cutting station and first transport element at least two components at a time are relayed from cutting position, to conveyor region of second transport element which corresponds to the respective group of lead frame.

10. The device as claimed in claim 5, wherein an advance stroke of lead frame which is produced by advance of lead frame feed is adjustable.

11. The device as claimed in claim 5, wherein first transport element for holding components at cutting stations and for transfer of these components to conveyor regions of the second transport element has holders, preferably vacuum chucks which execute a stipulated stroke between the cutting position and feed position on pertinent conveyor region.

12. The device as claimed in claim 5, wherein chucks move on a circular path around vertical axis.

13. The device as claimed in claim 5, wherein second transport element is made as a sorting section with means for removal of components.

14. The device as claimed in claim 5, wherein the second transport element is formed by a length of endlessly revolving belt which has a plurality of openings, of which at least one at a time forms a receiving area, and wherein a length of the belt which forms the conveyor section of the second transport element in the area of openings rests against at least one guide with at least one grooved-shaped vacuum channel which is connected to a vacuum or negative pressure shaft so that the belt with its side facing away from the guide on each opening forms a receiving area for keeping component under a vacuum.

15. The device as claimed in claim 5, wherein when components are transferred to at least one conveyor region of second transport element, in addition to transfer motion at least first transport element executes motion in a direction transverse to two conveyor regions in order to increase a distance of the components in lead frame to a first distance between vacuum chucks.

16. The device as claimed in claim 5, wherein in one working cycle at a time several components which adjoin one another in a direction transversely to a longitudinal direction of the lead frame are transferred as a component group from first transport element to conveyor region of second transport element.

17. The device as claimed in claim 5, wherein in one working cycle all components located in a row transversely to the longitudinal axis of the lead frame are punched out of the lead frame and transferred to conveyor region.

18. The device as claimed in claim 5, wherein the first transport element is formed by at least two transfer means, of which first transfer means transfers the component of first component group in which the components adjoin one another in a transverse direction of the lead frame, and second transfer means transfers components of second component group in which components adjoin one another likewise in the transverse direction of the lead frame, to first conveyor region or to second conveyor region of second transport element.

19. The device as claimed in claim 5, wherein first component group and second component group are offset against one another in a distance which two components in the lead frame have from one another in a longitudinal direction of the lead frame, and wherein there are drive and guide means for transfer means in order to move them from an initial position at cutting position into a delivery position on pertinent conveyor region of second transport element.

20. The device as claimed in claim 5, wherein in each working cycle the components of the first and second component group at cutting position are punched out of the lead frame and transferred with transfer means on respective conveyor region.

21. Device for conveying small components, comprising at least one transport section which is formed by at least one transport element with a plurality of holders made preferably as vacuum chucks for components, and chucks which are moved with transport element can be moved in a direction of their axis, wherein chucks can turn around their axis on transport element and wherein on transport section at least one turning or rotating station is formed on which the chucks are moved past and on which one driver which is actuated by a drive can be coupled to the chuck located at this turning station and can be actuated to rotate the chuck.

22. Device as claimed in claim 21, wherein chucks are provided each on one end with slot into which the driver fits during coupling.

23. Device as claimed in claim 21, wherein there is driver on the end of drive element which can be rotated by a drive around the axis of the respective chuck.

24. Device as claimed in claim 21, wherein driver is provided on one end of spindle.

25. Device as claimed in claim 21, wherein slot is a slotted cross.

26. Device as claimed in claim 21, characterized by guide which fits behind chucks, preferably which fits behind on head.

27. Device for conveying small components comprising at least one transport section which is formed by at least one transport element with a plurality of holders made preferably as vacuum chucks for components, the vacuum chucks each having a vacuum channel, one end of the vacuum channel forms an opening for keeping component under a vacuum, and chucks which are moved with transport element preferably clocked along transport section can be moved in the direction of their axis, preferably in a vertical axis, wherein on transport section at least one test station which checks the presence or absence of a component on chuck is provided with a photoelectric barrier which consists of light-emitting component, light detector, and a light path which is formed between them and into which vacuum channel provided in chucks is incorporated.

28. Device as claimed in claim 27, wherein vacuum channel on the other end is closed by an insert of transparent or translucent material.

29. The device as claimed in claim 27, wherein on the path of motion of chucks there are at least one light-emitting element and light detector on a common optical axis, spaced apart from one another such that in each chuck located in the test position this chuck with the axis of its vacuum channel is coaxial with the optical axis between light-emitting element and light detector.

30. Device as claimed in claim 27, wherein the transport element is steel belt which is a guided as a closed loop via at least two deflection rollers or deflection wheels and on which there are chucks on the outside structure with respect to the loop.

31. The device as claimed in claim 1, wherein the small components are small electrical components.

32. The device as claimed in claim 5, wherein the small components are small electrical components.

33. The device as claimed in claim 3, wherein the components punched out of the lead frame are transferred from the first transport element to the conveyor regions in the same number.

* * * * *